United States Patent [19]
Matsuzawa et al.

[11] Patent Number: 6,071,830
[45] Date of Patent: Jun. 6, 2000

[54] METHOD OF FORMING INSULATING FILM

[75] Inventors: Nobuyuki Matsuzawa; Toshiaki Hasegawa, both of Kanagawa, Japan

[73] Assignee: Sony Corporation, Tokyo, Japan

[21] Appl. No.: 08/838,196

[22] Filed: Apr. 16, 1997

[30] Foreign Application Priority Data

Apr. 17, 1996 [JP] Japan ..................................... 8-095159

[51] Int. Cl.⁷ .................................................. H01L 21/31
[52] U.S. Cl. .......................................... 438/778; 438/778
[58] Field of Search .................................... 438/128, 778, 438/780, 781, 787, 789, 790, 793, 794; 427/304, 305, 414; 156/307.3

[56] References Cited

U.S. PATENT DOCUMENTS 5,322,888  6/1994  Kato et al. ............................... 524/783
5,622,896  4/1997  Knotter et al. ........................... 438/123
5,693,172  12/1997 Zeldin et al. .......................... 156/307.3

Primary Examiner—David Nelms
Assistant Examiner—Reneé R. Berry
Attorney, Agent, or Firm—Hill & Simpson

[57] ABSTRACT

An object of the Invention is to provide a method of forming an insulating film capable of stably causing the insulating film (an organic insulating film) made of an organic material to stably adhere to the surface of a silicon oxide film for a long time without generation of any void The surface of the silicon oxide film is hydroxylated prior to forming the organic insulating film on the silicon oxide film, and the surface of the silicon oxide film is coated with a silane coupling agent. In a case where fluororesin is employed to form the organic insulating film, a compound containing a fluorine atom is preferably employed as the silane coupling agent.

2 Claims, 1 Drawing Sheet

METHOD OF FORMING INSULATING FILM

BACKGROUND OF THE INVENTION

1. Field of the Invention

The present invention relates to a method of forming an insulating film such that the insulating film made of an organic material is stacked on a silicon oxide film.

Description of Related Art

2. Prior Art

Hitherto, a film made of an organic material has been employed in a process for manufacturing a semiconductor apparatus to serve as a resist mask for patterning a predetermined film or injecting ions into the same.

In recent years, reduction of the dielectric constant of an interlayer insulating film has been required in order to reduce the capacity of wiring, which has been enlarged because the semiconductor devices have been fined. As a film which is capable of realizing a low dielectric constant, which cannot be realized by inorganic film, an organic film has attracted attention.

As compared with the $SiO_2$ film having a relative dielectric constant of 3.9 and the SiOF film having a relative dielectric constant of 3.7 to 3.2 each of which has been employed as the interlayer insulating film, the polyimide resin film and the fluorine resin film have considerably low relative dielectric constants of 3.5 to 3.0 and 2.5 to 1.9, respectively. Therefore, use of an interlayer insulating film made of an organic film in a semiconductor device having a design rule of 0.18 μm or smaller has been considered.

When the organic film is employed as the resist mask, long-term reliability has not been required for the adhesive property with respect to the film serving as the base because the organic film has been removed before the semiconductor device is manufactured. However, the organic film is retained after the semiconductor device has been manufactured in a case where the organic film is employed as the interlayer insulating film. Therefore, the organic film needs to stably adhere to the base film for a long time. The reason for this is that insufficient adhesive property between the organic film and the base film tends to causes a defect in the semiconductor device. In a case where an insulating film made of fluororesin is formed on a silicon oxide film, the adhesive property between the two films deteriorates. If the base silicon oxide film has slight irregularity, the concave portions cannot sufficiently be plugged with the insulating film made of the fluororesin.

FIG. 1 shows wafer having such a structure that a second silicon oxide film 104, an organic insulating film 105 made of fluororesin and a third silicon oxide film 106 are stacked to form an interlayer insulating film for covering a wiring pattern 103 formed on a first silicon oxide film 102 on a silicon substrate 101. To form the organic insulating film 105 made of fluororesin, a process is performed in which the second silicon oxide film 104 is formed, coating formed such that the fluororesin is dissolved in a solvent is applied and the solvent is removed by heat treatment in a temperature range higher than a glass-transition level. However, the formed organic insulating film 105 has voids 107 formed in the wiring pattern 103. The reason for this is that the fluororesin having a considerably high coefficient of thermal expansion at temperatures higher than the glass-transition level, involves great volume change when the heat treatment is performed for removing the solvent.

SUMMARY OF THE INVENTION

In view of the foregoing, an object of the present invention is to provide a method of forming an insulating film made of an organic material capable of preventing generation of a void on an silicon oxide film and enabling the insulating film to stably exist for a long time.

To achieve the foregoing object, a method of forming an insulating film according to the present invention comprises the steps of holding silane coupling agent on the surface of a silicon oxide film; and laminating an insulating film made of an organic material (hereinafter called an "organic insulating film").

The foregoing object can be achieved by another method having the step of hydroxylating the surface of the silicon oxide film, followed by laminating an organic insulating film.

By holding the silane coupling agent after the surface of the silicon oxide film has been hydroxylated, the hydroxyl group is caused to react with the silane coupling agent. As a result, the adhesive property between the silicon oxide film and the organic insulating film can furthermore be improved. In this case, it is preferable that the silane coupling agent held on the silicon oxide film be heated, if necessary. Thus, reactions between the functional groups of the silane coupling agent and the hydroxyl groups in the surface layer of the silicon oxide film can be enhanced.

It is preferable that the compound expressed by the following formula be employed as the silane coupling agent:

$$Si(OH)w(X)x(OR)yR'z \tag{1}$$

where w, x, y and z each are an integer satisfying $0 \leq w \leq 3$, $0 \leq x \leq 3$, $0 \leq y \leq 3$, $1 \leq z \leq 3$, $w+x+y \geq 1$ and $w+x+y+z=4$, X is halogen, OR is an alkoxyl group, and R' is any material selected from a group consisting of an alkyl group, a halogenated alkyl group, an alkene group, an aminoalkyl group and their derivatives or an arbitrary combination of the same when $z \geq 2$.

In the compound expressed by formula (1), the hydroxyl group indicated by OH, the alkoxyl group indicated by OR and halogen indicated by X react with hydroxyl group (—OH) in the surface layer of the silicon oxide film to bond the silicon oxide film and the silane coupling agent to each other. Therefore, it is preferable that one or more branches of the Si atom be bonded to any one of a hydroxyl group, an alkoxy group or halogen (that is, $w+x+y \geq 1$ be satisfied). Note that two or more types of materials selected from the hydroxyl group, the alkoxy group and the halogen may be bonded to the common Si atom.

The alkyl group, the halogenated alkyl group, the alkene group, the aminoalkyl group and their derivatives indicated by R' perform adsorption with the organic insulating film which will be formed later. It is preferable that one or more branches of four branches of the Si atom be bonded to the foregoing substituent (that is, $z \geq 1$ is satisfied in Formula (1)). If two or more R' are bonded to the common Si atom (that is, if $z \geq 2$ is satisfied in Formula (1)), the plural R' may be substituents having the same structure or those having different structures.

Although the organic material for forming the organic insulating film is not limited particularly, a compound containing a fluorine atom (hereinafter called "fluororesin") is expected to be employed to form the interlayer insulating film because of a very low specific dielectric constant and performance of preventing diffusion of Cu in a case where Cu is employed to form the wiring.

When the organic insulating film made of the fluororesin is formed, it is preferable that a silane coupling agent containing fluorine atom be employed. That is, it is preferable that one or more R' in Formula (1) contains a fluorine atom. In this case, R' may be any one of a halogenated alkyl group into which fluorine atom has been introduced as halogen, an alkene group, an aminoalkyl group and their derivatives into each of which a fluorine atom has been introduced.

The present invention is able to improve the adhesive property between the silicon oxide film and the organic insulating film. In a case where the fluororesin film is formed as the organic insulating film, use of the silane coupling agent containing fluorine atom enables the adhesive property to furthermore be improved.

Other and further objects, features and advantage of the invention will be appear more fully from the following description.

DETAILED DESCRIPTION OF PREFERRED EMBODIMENTS

Embodiments of the present invention will now be described.

First Embodiment

This embodiment is structured such that the surface of a flat silicon oxide film is hydroxylated, and then a silane coupling agent is applied and an organic insulating film is formed.

Initially, wafer formed such that a silicon oxide film having a thickness of 0.5 $\mu$m is formed on a flat substrate is prepared. The wafer is placed in a dry etching apparatus so as to subject the surface of the silicon oxide film to a plasma treatment under the following conditions:

Plasma Treatment Condition
  Gas Introduced: Ar flow rate 200 sccm
    $H_2$ flow rate 50 sccm
  Pressure: 13.3 Pa
  RF Electric Power: 200 W (13.56 MHz)
  Temperature of Wafer: Room Temperature As a result, the Si—O bond in the surface layer of the silicon oxide film is hydroxylated and thus formed into Si—OH.

Then, trimethylchlorosilane $(CH_3)_3SiCl$ is prepared as the silane coupling agent. A solution, in which the trimethylchlorosilane $(CH_3)_3SiCl$ is, by 1 wt %, dissolved in carbon tetrachloride, is used to spin-coat the foregoing wafer, and then the wafer is allowed to stand at room temperature for about one hour. As a result, the trimethylchlorosilane is chemically-bonded with the hydroxyl group in the surface layer of the silicon oxide film.

Then, the wafer is cleaned with carbon tetrachloride so that excess quantity of non-reacted trimethylchlorosilane is removed. As a result, wafer including the silicon oxide film having a modified surface is obtained.

Then, an organic insulating film made of polymethylmethacrylate manufactured by Polyscience and having a molecular weight of 100000 is formed on the silicon oxide film having the modified surface to have a thickness of about 1 $\mu$m. To form the organic insulating film, a chloroform solution of 2 wt % polymethylmethacrylate is prepared and applied onto the silicon oxide film by a spin coating method. Then, a vacuum drier is operated to dry the wafer at 50° C. for 3 hours in order to sufficiently remove the solvent in the film.

Since this embodiment has such a structure that the organic insulating film is formed on the silicon oxide film through the silane coupling agent, the adhesive property between the silicon oxide film and the organic insulating film can be improved.

Second Embodiment

Figure 2:
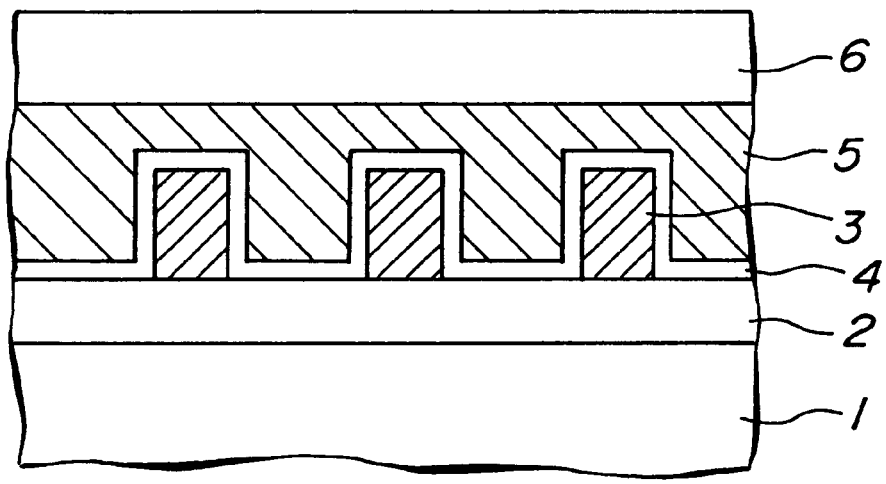
FIG. 2 is a schematic cross sectional view showing wafer having an organic insulating film formed on a silicon oxide film for covering a wiring pattern.

In this embodiment, a structure in which an organic insulating film is formed on the surface of a silicon oxide film formed thinly to cover the wiring pattern will now be described with reference to FIG. 2.

Initially, a first silicon oxide film 2 is formed on a silicon substrate 1, and then a wiring pattern 3 is formed. Then, a second silicon oxide film 4 is formed. Note that the first silicon oxide film 2 is formed by a plasma CVD method using $SiH_4$ gas and $O_2$ gas to have a thickness of 500 nm. The wiring pattern 3 is formed such that an Al—Si film is formed by a sputtering method and then photolithography and etching are performed to have a predetermined pattern. The second silicon oxide film 4 is formed by a plasma CVD method using $SiH_4$ gas and $O_2$ gas to have a thickness of 100 nm. Note that the foregoing thickness is the thickness of the portion formed on the wiring pattern 3. The second silicon oxide film 4 has a smaller thickness in a narrow trench portion in the wiring pattern 3.

The surface of the silicon oxide film is subjected to a plasma treatment under the following conditions.
Plasma Treatment Conditions
  Gas Introduced: $N_2O$ flow rate 200 sccm
  Pressure: 13.3 Pa
  RF Electric Power: 300 W (13.56 MHz)
  Temperature of Wafer: Room Temperature As a result, the Si—O bond in the surface layer of the second silicon oxide film 4 is hydroxylated and thus formed into Si—OH.

Then, 3, 3, 4, 4, 5, 5, 6, 6, 6-nonafluorohexyltrichlorosilane $(CF_3)(CF_2)_3(CH_2)_2SiCl_3$ is prepared, and a solution in which it is dissolved in carbon tetrachloride in a quantity of 1 wt % is used to spin-coat the wafer, and then the wafer is allowed to stand at room temperature for about one hour. As a result, the silane coupling agent is chemically bonded with the hydroxyl group in the surface layer of the silicon oxide film.

Then, the wafer is cleaned with carbon tetrachloride so that excess quantity of non-reacted silane coupling agent is removed.

An organic insulating film 5 made of amorphous teflon (TEFLON AF which is trade name of Dupont) is formed on the second silicon oxide film 4 having the modified surface to have a thickness of about 1 $\mu$m. To form the organic insulating film 5, coating having viscosity of about 30 cp is prepared by dissolution in a fluorocarbon solvent (FLORENATE which was trade name of 3M), and then the coating is used to perform spin coating at a revolution speed of 3000 rpm so that the second silicon oxide film 4 is coated with the same. After the coating process, the wafer is baked for two minutes under conditions that the nitrogen gas is used as the atmospheric gas, the temperature is 100° C. and the pressure is the atmospheric pressure. Then, an annealing process is performed under conditions that the atmospheric gas is nitrogen gas and the temperature is 260° C.

Then, a plasma CVD process using $SiH_4$ gas and $O_2$ gas is performed so that a third silicon oxide film 6 having a thickness of 500 nm is formed.

As a result, the wiring pattern 3 is covered with the second silicon oxide film 4, the organic insulating film 5 and the third silicon oxide film 6. A laminate composed of the second silicon oxide film 4, the organic insulating film 5 and the third silicon oxide film 6 is an interlayer insulating film having a considerably low dielectric constant as a result of the existence of the organic insulating film 5. Since the organic insulating film 5 is made of fluororesin, excellent heat resistance is obtained.

Also this embodiment having such a structure that the organic insulating film 5 is formed on the second silicon oxide film 4 through the silane coupling agent is able to improve the adhesive property with the second silicon oxide film 4 though the organic insulating film 5 is made of the fluororesin having a considerably high coefficient of thermal expansion at temperatures higher than the glass-transition temperature.

Although the embodiments of the present invention have been described, the present invention is not limited to the foregoing descriptions. For example, although both of the first embodiment and the second embodiment have such a structure that both of the hydroxylation of the surface of the silicon oxide film and coating of the silane coupling agent were performed, only either the hydroxylation of the surface of the silicon oxide film or application of the silane coupling agent may be performed.

Although the foregoing embodiments have such a structure that the surface of the silicon oxide film is hydroxylated by irradiating the surface with the $Ar+H_2$ plasma and the $N_2O$ plasma, a treatment using hydrofluoric acid or exposure to steam may be performed in place of the foregoing operations. If the treatment using hydrofluoric acid is performed, a process is required which comprises the steps of immersing the wafer having the silicon oxide film formed thereon in 1 mol % hydrofluoric acid solution for 10 seconds and cleaning the wafer with pure water for about 10 minutes. If the exposure to steam is performed, a process is required in which the wafer having the silicon oxide film formed thereon is exposed to steam in an atmosphere that the temperature is room temperature and the pressure is about 6700 Pa.

Although the foregoing embodiments have such a structure that the silane coupling agent is held on the silicon oxide film by applying the solution in which the silane coupling agent is dissolved in the solvent by the spin coating method, the type of the silane coupling agent, that of the solvent and the concentration of the silane coupling agent may arbitrarily be changed. For example, the concentration of the silane coupling agent may be changed within a range from 0.01 wt % to 30 wt %, preferably from 0.2 wt % to 4 wt %. Also the coating method is not limited to the spin coating method. For example, a dipping method or a vacuum evaporation method may be employed.

The type of the silane coupling agent is not limited to that according to the foregoing embodiments. Any compound expressed by Formula (2) may be employed.

$$Si(OH)w(X)x(OR)yR'z \qquad (2)$$

wherein w, x, y and z each are an integer satisfying $0 \leq w \leq 3$, $0 \leq x \leq 3$, $0 \leq y \leq 3$, $1 \leq z \leq 3$, $w+x+y \geq 1$ and $w+x+y+z$ 4, X is halogen, OR is an alkoxyl group, and R' is any material selected from a group consisting of an alkyl group, a halogenated alkyl group, an alkene group, an aminoalkyl group and their derivatives or an arbitrary combination of the same when $z \geq 2$.

Specifically, the following materials are known: trimethylchlorosilane, γ-chloropropyltrimethoxysilane, vinyltrichlorosilane, vinyltriethoxysilane, vinyltrimethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, γ-mercaptopropyltrimethoxysilane,-γ-aminopropyltriethoxysilane, N-β-(aminoethyl)-γ-aminopropyltrimethoxysilane, γ-ureidopropyltriethoxysilane and N-β-(aminoethyl)-β-aminopropylmethyldimethoxysilane.

In the case where the fluororesin is employed as the organic material for forming the organic insulating film, it is preferable that a silane coupling agent containing fluorine atom be employed. It is preferable that a material be employed in which one or more R' expressed in Formula (2) contains a fluorine atom. Specifically, any one of the foregoing materials may be employed: polyfluoroalkyltrichlorosilane $(CF_3)(CF_2)n(CH_2)_mSiCl_3$, polyfluoroalkyltrimethoxysilane $(CF_3)(CF_2)n(CH_2)_mSi(OCH_3)_3$, polyfluoroalkyltrihydroxysilane $(CF_3)(CF_2)n(CH_2)mSi(OH)_3$ and the like. Note that n is an integer not smaller than 2. Also any one of the foregoing materials may be employed: 3, 3, 3-trifluoropropyltrichlorosilane, methyl-3, 3, 3-trifluoropropyldichlorosilane, dimethoxymethyl-3, 3, 3-trifluoropropylsilane, 3, 3, 4, 4, 5, 5, 6, 6, 6-nonafluorohexylmethyldichlorosilane, 3-trifluoroacetoxypropyltrimethoxysilane and the like.

Although the first embodiment has such a structure that the silane coupling agent is applied and then the wafer is allowed to stand for about one hour, another process may be employed in which the wafer is heated to 50 to 200° C., preferably about 100° C., to enhance the reactions between the hydroxyl group in the surface layer of the silicon oxide film and the silane coupling agent.

Although the foregoing embodiments have such a structure that the silane coupling agent is supplied to the surface of the silicon oxide film prior to forming the organic insulating film, the silane coupling agent may be supplied to the surface of the silicon oxide film simultaneously with forming of the organic insulating film. The silane coupling agent may be supplied simultaneously with forming of the organic insulating film by a method in which a coating containing the material of the organic insulating film and the silane coupling agent is applied to the surface of the silicon oxide film or a method in which the silane coupling agent and the material for the organic insulating film are simultaneously evaporated by a vacuum evaporation method. It is preferable that the weight ratio of the silane coupling agent and the material for the organic insulating film (the silane coupling agent/organic material) be 1/1000 to 1/5, more preferably 1/500 to 1/10. If the quantity of the silane coupling agent is too small, the effect of improving the adhesive property between the silicon oxide film and the organic insulating film becomes unsatisfactory. If the quantity of the silane coupling agent is too large, the strength of the organic insulating film is weakened excessively.

Also the organic material for forming the organic insulating film is not limited to the foregoing material. For example, polyimide resin may be employed. The polyimide resin film can be formed by an applying process and heat treatment. Note that polyimide may be denatured by siloxane for the purpose of improving the thermal characteristics. As an alternative to Teflon AF (trade name of Dupont) expressed by Formula (3), Cytop (trade name of Asahi Glass) expressed by Formula (4), polyallylether fluoride expressed by Formula (5) may be employed. Each of the foregoing organic materials can be applied by a spin coating method.

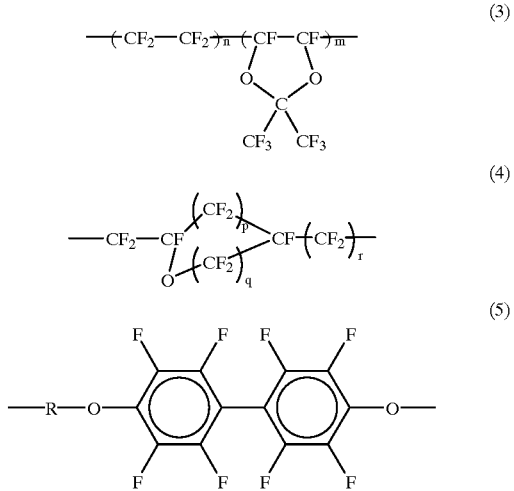

The organic insulating film may be formed by benzocyclobutene or poly-para-xylylene. In this case, a CVD method may be employed. Also a material in which fluorine has been introduced into the foregoing material can be formed into a film by the CVD method.

Although the foregoing embodiments have such a structure that the silicon oxide film is formed by the plasma CVD method using the $SiH_4$ gas and the $O_2$ gas, a plasma CVD method may be employed which uses tetraethoxysilane (TEOS) gas and $O_2$ gas. In order to explain the advantage of the present invention, the adhesive property of each of the organic insulating films according to the first and second embodiment was evaluated.

EXAMPLE 1

The adhesive property of an organic insulating film formed on the surface of a flat silicon oxide film having the structure according to the first embodiment was evaluated. Note that the type of the silane coupling agent and the material of the organic insulating film were varied.

Specifically, as performed in the first embodiment, wafer having the silicon oxide film formed on the substrate thereof was prepared. The surface of the silicon oxide film was hydroxylated by a plasma process using $Ar/H_2$ mixture gas. As the silane coupling agent, samples (A) to (E) shown in Table 1 were prepared so as to be applied to the surface of the silicon oxide film by the method according to the first embodiment.

TABLE 1

| | Formula |
|---|---|
| Silane Coupling Agent (A) | $(CH_3)_3SiCl$ |
| Silane Coupling Agent (B) | $CH_2 = CHSi\,(OCH_3)_4$ |
| Silane Coupling Agent (C) | $H_2NC_1H_2NHC_3H_4Si\,(OCH_3)_3$ |
| Silane Coupling Agent (D) | $CF_3\,(CF_2)_3CH_2CH_2Si\,(CH_3)\,Cl_2$ |
| Silane Coupling Agent (E) | $CH_2 = CHSiCl_3$ |

Organic insulating films respectively composed of polymer compound (a), polymer compound (b) and polymer compound (c) were formed on the silicon oxide films respectively coated with the foregoing silane coupling agents.

The polymer compound (a) was polymethylmethacrylate manufactured by Poly Science and having a molecular weight of 100,000, polymer compound (b) was polyvinyl alcohol manufactured by Poly Science and having a molecular weight of 25,000 and polymer compound (c) is fluororesin manufactured by Dupont and having trade name of Teflon AF1600.

The organic insulating film made of the polymer compound (a) was manufactured by the method according to the first embodiment. The organic insulating film made of the polymer compound (b) was formed by preparing 2 wt % solution of the polymer compound (b) and by coating the surface of the silicon oxide film with the 2 wt % solution. The organic insulating film made of the polymer compound (c) was formed by dissolving the polymer compound (c) in 2 wt % solvent (FLORENATE which was trade name of 3M) and by coating the surface of the silicon oxide film with the solution by a spin coating method. Note that the solvent in the film was removed sufficiently after the coating operation.

As a result, 15 types of sample wafers respectively having modified surfaces by the silane coupling agents (A) to (E) and having the organic insulating films made of the polymer compounds (a) to (c) were obtained.

In order to make comparisons, three types of the foregoing organic insulating films were formed on the organic insulating films, the surfaces of which were not modified by the silane coupling agents, so that sample wafers were obtained.

Then, the adhesive property between the silicon oxide film and the organic insulating film of each of 18 types of the sample wafers was evaluated.

That is, a cutter knife was used to form 100 square flaws each having size of 2 mm×2 mm on the surface of the organic insulating film on each sample wafer. Then, cellophane adhesive tape on the market was allowed to adhere and then it was removed so that the number of the flaw portions in each of which the organic insulating film was separated from the silicon oxide film was counted.

Table 2 shows results of the evaluation of the sample wafers.

TABLE 2

| | polymer Compound (a) | polymer Compound (b) | polymer Compound (c) |
|---|---|---|---|
| Silane Coupling Agent (A) | 43 | 45 | 67 |
| Silane Coupling Agent (B) | 52 | 60 | 78 |
| Silane Coupling Agent (C) | 33 | 26 | 52 |
| Silane Coupling Agent (D) | 47 | 55 | 38 |
| Silane Coupling Agent (E) | 48 | 38 | 73 |
| No Surface Modification | 96 | 99 | 100 |

As can be understood from Table 2, the organic insulating film in the flaw portion of each sample wafer manufactured without using the silane coupling agent was substantially separated regardless of the type of the polymer compounds (a) to (c). On the other hand, the sample wafers having the silicon oxide films, the surfaces of which were modified by the silane coupling agents, were able to considerably prevent separation of the organic insulating films regardless of the combinations of the silane coupling agents (A) to (E) and the polymer compounds (a) to (c). That is, modification of the surface of the silicon oxide film by using the silane coupling agent is able to significantly improve the adhesive property between the silicon oxide film and the organic insulating film.

In the case where any one of the silane coupling agents (A), (B), (C) and (E) was employed, the organic insulating film made of the polymer compound (c) was easily separated as compared with the organic insulating films respectively made of the polymer compounds (a) and (b). In the case where the silane coupling agent (D) was employed, the organic insulating film made of the polymer compound (c) was not easily separated as compared with the organic insulating films respectively made of the polymer compounds (a) and (b). Thus, it is preferable that the silane coupling agent, such as the silane coupling agent (D) of a type having the substituent containing the fluorine atom, be previously applied with the surface of the silicon oxide film when the organic insulating film made of, for example, the polymer compound (c) made of the fluororesin, is formed.

EXAMPLE 2

In this example, the adhesive property of an organic insulating film formed on a wafer having a silicon oxide film formed to cover the wiring pattern thereof and having slight irregularity was evaluated.

Specifically, the surface of the second silicon oxide film 4 covering the wiring pattern 3 was hydroxylated by the plasma treatment using the $N_2O$ gas by the method according to the second embodiment. Then, the organic insulating film 5 made of Teflon AF (trade name of Dupont) was formed, and then the third silicon oxide film 6 was formed. Thus, a sample wafer was manufactured which was called sample wafer (a).

Sample wafers were manufactured by the method according to the second embodiment except for the organic insulating film 5 made of other fluororesin (Cytop which was trade name of Asahi Glass), FLARE (trade name of Alied Signal) and polyimide fluoride and having a thickness of 500 nm being formed. Also the fluororesin was formed by performing dissolution in a solvent so as to be applied by a spin coating method, followed by performing baking and annealing, similarly to the second embodiment. However, the annealing temperature was changed to 350° C. A sample wafer having the organic insulating film 5 made of Cytop (trade name) was called sample wafer (b), a sample wafer having the organic insulating film 5 made of FLARE (trade name) was called sample wafer (c), and a sample wafer having the organic insulating film 5 made of polyimide fluoride was called sample wafer (d).

A process similar to the second embodiment was performed except for coating of the silane coupling agent after hydroxylation of the surface of the second silicon oxide film 4 being omitted and the organic insulating film 5 made of poly-para-xylylene being formed, so that sample wafer (e) was manufactured. The organic insulating film 5 made of poly-para-xylylene was formed such that a pressure reduction CVD apparatus was used to sublimate diparaxylene at 200° C. and to decompose it to xylene monomer at 650° C. so as to be supplied in a state in which it was heated to 150° C.

In order to make a comparison, sample wafer (f) was manufactured such that the organic insulating film was formed without hydroxylation of the surface of the silicon oxide film and application of the silane coupling agent. Specifically, a second silicon oxide film 104 was formed to cover a wiring pattern 103 formed on a first silicon oxide film 102 on a silicon substrate 101, as shown in FIG. 2. Then, the surface of the second silicon oxide film 104 was not hydroxylated and no silane coupling agent was applied. However, Teflon AF (trade name) was applied so that an organic insulating film 105 was formed, and then a third silicon oxide film 106 was formed. The organic insulating film 105 was formed by a method similar to that according to the second embodiment.

The sample wafers (a) to (f) were examined whether or not a void was generated in each of the organic insulating films 5 and 105.

Figure 1:
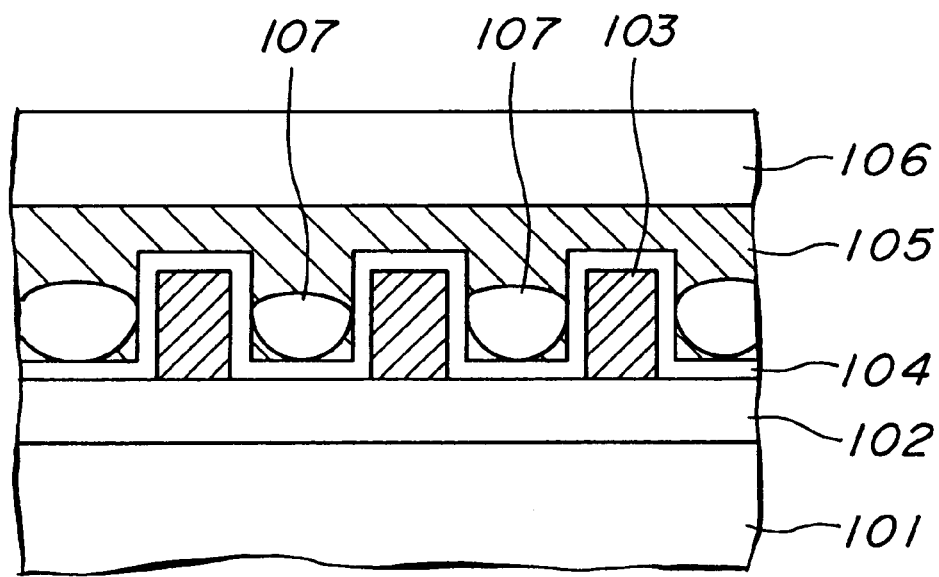
FIG. 1 is a schematic cross sectional view showing wafer having an organic insulating film formed on a silicon oxide film for covering a wiring pattern by a conventional method.

As a result, no void was generated in the organic insulating film 5 even in the narrow trench portion between the wiring patterns 3 of each of the sample wafers (a) to (e) as shown in FIG. 1. However, void was generated in the organic insulating film 105 in the trench portion between the wiring patterns 3 of the sample wafer (f) as shown in FIG. 2.

As a result, a fact was understood that the adhesive property between the second silicon oxide film 4 and the organic insulating film 5 of each of the sample wafers (a) to (e) was satisfactory to prevent separation of the material of the organic insulating film 5 from the second silicon oxide film 4 even if thermal expansion took place due to heat applied for the purpose of removing the solvent when the organic insulating film 5 was formed.

That is, a fact was confirmed that hydroxylation of the surface of the second silicon oxide film 4 and further application of the silane coupling agent is able to improve the adhesive property between the second silicon oxide film 4 and the organic insulating film 5.

As described above, the present invention structured to hydroxylate the surface of the silicon oxide film and/or hold the silane coupling agent on the surface of the silicon oxide film is able to improve the adhesive property between the silicon oxide film and the insulating film formed on the silicon oxide film and made of the organic material.

As a result, the reliability of a semiconductor device using the organic film as the component thereof can be improved. Thus, the applicable range for the organic film can be widened.

Therefore, satisfactorily improved reliability can be realized when an organic material having a low dielectric constant is employed as an interlayer insulating film capable of reducing the capacity of the wiring.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A method of forming an insulating film on wafer substrates comprising the steps of:
   (a) providing a wafer having a surface with a silicon oxide film formed by plasma CVD disposed on said surface;
   (b) hydroxylating the silicon oxide film by subjecting the silicon oxide film to a plasma processing using a plasma comprising $N_2O$ or a mixture of Ar and $H_2$ or to provide a hydroxylated silicon oxide film;
   (c) reacting the hydroxylated silicon oxide film with a silane coupling agent to provide a silanized silicon oxide film, the silane coupling agent having the formula $$Si(OH)_w(X)_x(OR)_yR'_z \quad (1)$$

where w, x, y and z each are an integer satisfying $0 \leq w \leq 3$, $0 \leq x \leq 3.0 \leq y \leq 3.1 \leq z \leq 3$, $w+x+y>1$ and $w+x+y+z=4$.

X is halogen, OR is an alkoxyl group, and R' is selected from a group consisting of an alkyl group, a halogenated alkyl group, an alkene group, an aminoalkyl group and their derivatives or an arbitrary combination of the same when $z \geq 2$ and wherein at least one R' expressed in formula (1) contains a fluorine atom and the organic insulating film material is composed of a compound containing a fluorine atom;

(d) coating an organic insulating film forming solution on the silanized silicon oxide film; and (e) heating the film forming solution to remove solvent and provide a firmly adherent organic insulating film on the silanized silicon oxide film.

2. A method of forming an insulating film according to claim 1, wherein a second silicon oxide film is, by a plasma CVD method, laminated on the organic insulating film made of the organic material.

* * * * *